United States Patent
Wu et al.

(10) Patent No.: US 6,710,666 B1
(45) Date of Patent: Mar. 23, 2004

(54) CHARGE PUMP STRUCTURE FOR REDUCING CAPACITANCE IN LOOP FILTER OF A PHASE LOCKED LOOP

(75) Inventors: Ching-San Wu, Hsin-Chu (TW); Chien-Ming Chen, Hsin-Chu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 0 days.

(21) Appl. No.: 10/065,658

(22) Filed: Nov. 7, 2002

(51) Int. Cl.[7] ............................................. H03L 7/89
(52) U.S. Cl. .................... 331/17; 331/25; 327/148; 327/536; 327/157; 375/374
(58) Field of Search ................ 331/17, 25; 327/157, 327/148, 536, 111, 112; 375/374

(56) References Cited

U.S. PATENT DOCUMENTS

| | | | | |
|---|---|---|---|---|
| 5,594,390 A | * | 1/1997 | Holzer | 331/17 |
| 5,898,336 A | * | 4/1999 | Yamaguchi | 327/157 |
| 6,140,853 A | * | 10/2000 | Lo | 327/157 |
| 6,320,435 B1 | * | 11/2001 | Tanimoto | 327/156 |
| 6,329,882 B1 | * | 12/2001 | Fayneh et al. | 331/10 |
| 6,600,351 B2 | * | 7/2003 | Bisanti et al. | 327/157 |
| 2001/0028694 A1 | * | 10/2001 | Kushibe | 375/376 |
| 2003/0025538 A1 | * | 2/2003 | Bisanti et al. | 327/156 |

* cited by examiner

*Primary Examiner*—Robert Pascal
*Assistant Examiner*—Joseph Chang
(74) *Attorney, Agent, or Firm*—Winston Hsu

(57) ABSTRACT

A charge pump for reducing capacitance in a loop filter of a phase locked loop. The loop filter contains a resistor and a capacitor. The charge pump includes first and second input current sources for supplying first and second currents to the charge pump, a first output current source for receiving the first current from the charge pump, and a second output current source for receiving the second current from the charge pump. The charge pump also contains a plurality of up pulse switches and down pulse switches for controlling current flow through the charge pump such that only a fraction of the current that flows through the resistor of the loop filter flows into and out of the capacitor for charging and discharging the capacitor. The size of the capacitor can be reduced accordingly based on the amount of current used to charge and discharge the capacitor.

16 Claims, 9 Drawing Sheets

CHARGE PUMP STRUCTURE FOR REDUCING CAPACITANCE IN LOOP FILTER OF A PHASE LOCKED LOOP

BACKGROUND OF INVENTION

1. Field of the Invention

The present invention relates to a charge pump of a phase locked loop, and more specifically, to an improved charge pump structure allowing for a smaller capacitor to be used in a loop filter of the phase locked loop.

2. Description of the Prior Art

A phase locked loop Is used for frequency control. Please refer to FIG. 1. FIG. 1 is a block diagram of a phase locked loop (PLL) 10 according to the prior art. The PLL 10 contains a phase detector 12, which is used for comparing phases of two input signals IN1 and IN2. Based on a phase difference between the two Input signals IN1 and IN2, the phase detector 12 then outputs either an up signal UP or a down signal DN to a charge pump circuit 14. Based on receipt of either the up signal UP or the down signal DN, the charge pump circuit 14 sends (or receives) a control current to (from) a loop filter 16. This control current is used for charging or discharging a capacitor within the loop filter 16, as will be explained more thoroughly below. Finally, a control voltage $V_{VCONA}$ is outputted from the loop filter 16 and fedg Into a voltage controlled oscillator (VCO) 18. The VCO 18 generates the output frequency IN2 based on the control voltage $V_{VCONA}$ that is fed into the VCO 18. Together, the phase detector 12, the charge pump circuit 14 the loop filter 16, and the VCO 18 form the PLL 10, which is a negative feedback loop.

Please refer to FIG. 2. FIG. 2 is a diagram illustrating operation of the phase detector 12 of the PLL 10 when generating the up signal UP. As stated above. the phase detector 12 compares two inputted signals IN1 and IN2, and outputs either the up signal UP or the down signal DN based on the phase difference between IN1 and IN2. In FIG. 2 the IN1 signal leads the IN2 signal by a phase difference of θ1. The phase detector 12 is able to detect this phase difference and then outputs a pulse of the up signal UP. A pulse width of the up signal UP is directly proportional to the phase difference θ1 between IN1 and IN2. This up signal UP is ultimately used to increase the frequency of IN2 so that IN1 and IN2 can become in-phase.

Please refer to FIG. 3. FIG. 3 is a diagram illustrating operation of the phase detector 12 of the PLL 10 when generating the down signal DN. In FIG. 3, the IN2 signal leads the IN1 signal by a phase difference of θ2. The phase detector 12 is able to detect this phase difference and then outputs a pulse of the down signal DN. A pulse width of the down signal DN is directly proportional to the phase difference θ2 between IN1 IN2. This down signal DN is ultimately used to decrease the frequency of IN2 so that IN1 and IN2 can become in-phase.

Please refer to FIG. 4. FIG. 4 is a circuit diagram of the charge pump circuit 14 and the loop filter 16 of the prior art. The charge pump circuit 14 comprises an input current source 20, which is connected to node NA of the charge pump circuit 14 that inputs a current with a magnitude of I, and an output current source 22, which Is connected to node NB of the charge pump circuit 14, that outputs a current with a magnitude of I. The charge pump circuit 14 further comprises an up.pulse switch swUP connected between node NA and output node VCONA, and a down pulse switch swDN connected between node VCONA and node NB. The loop filter 16 comprises a resistor R connected between the output node VCONA and an intermediate node VCON, and a capacitor C connected between the intermediate node VCON and ground.

When a pulse of the up signal UP is received from the phase detector 12, the up pulse switch swUP is programmed to close for charging the capacitor C. At all other times, the up pulse switch swUP remains open. On the other hand, when a pulse of down signal DN is received from the phase detector 12, the down pulse switch swDN is programmed to close for discharging the capacitor C. At all other times, the down pulse switch swDN remains open. As shown in FIG. 4, both the up pulse switch swUP and the down pulse switch swDN are shown open since neither the up signal UP nor the down signal DN are received by the charge pump circuit 14. Therefore, no current is able to flow from the charge pump circuit 14 to the loop filter 16 in order to charge or discharge the capacitor C.

Please refer to FIG. 5. FIG. 5 is a circuit diagram of the prior art charge pump circuit 14 and loop filter 16 in a charging mode. In FIG. 5, the charge pump circuit 14 receives a pulse of the up signal UP from the phase detector 12. Therefore, the up pulse switch swUP is closed and the down pulse switch swDN is open. A dotted line is shown illustrating a path of current with the magnitude of I from the input current source 20 through the resistor R and through the capacitor C. Since the current I is flowing through the capacitor C, the voltage across the terminals of the capacitor C will increase, and the capacitor C will be charged according to Eqn.1 shown below.

$$i = C \frac{dv}{dt} \tag{1}$$

Eqn.1 shows that the longer the current I is flowing through the capacitor C, the more charged the capacitor C will become, and the larger a voltage $V_{VCON}$ will be. From Eqn.1, a simple proportionality relationship can be made, which is shown in Eqn.2.

$$\frac{i}{k} = \frac{C}{k} \tag{2}$$

In Eqn.2, k is a constant. The present invention makes great use of Eqn.2 and the significance of this equation will be explained fully below. As mentioned above, the voltage $V_{VCONA}$ is an output voltage that it outputted from the loop filter 16 to the VCO 18 for controlling the VCO 18. Eqn.3 below shows the relationship between the voltage $V_{VCONA}$ and the voltage $V_{VCON}$.

$$V_{VCONA} = IR + V_{VCON} \tag{3}$$

Eqn.3 shows that the voltage $V_{VCONA}$ depends on the sum of the current I flowing through resistor R and the voltage $V_{VCON}$.

Please refer to FIG. 6. FIG. 6 is a circuit diagram of the prior art charge pump circuit 14 and loop filter 16 in a discharging mode. In FIG. 6, the charge pump circuit 14 receives a pulse of the down signal DN from the phase detector 12. Therefore, the down pulse switch swDN is closed and the up pulse switch swUP is open. A dotted line is shown illustrating a path of current with the magnitude of I from the capacitor C through the resistor R to the output current source 22. Since the current I is leaving the capacitor C, the voltage across the terminals of the capacitor C will decrease, and the capacitor C will be discharged according to Eqn.1.

Unfortunately, when fabricating the prior art charge pump circuit 14 and loop filter 16 on an Integrated circuit (IC), the area of the capacitor C takes up a very large area of the IC. Not only does this increase the cost to manufacture the ICs containing the prior art PLL 10, but it also makes it difficult to design and build smaller ICs due to the large size of the capacitor C.

SUMMARY OF INVENTION

It is therefore a primary objective of the claimed invention to provide a charge pump circuit for reducing capacitance in a loop filter of a phase locked loop in order to solve the above-mentioned problems.

According to the claimed invention, a charge pump circuit is used for reducing capacitance in a loop filter of a phase locked loop. The loop filter contains a resistor electrically connected to the charge pump circuit at an output node and a capacitor being electrically connected to the resistor at an intermediate node. The charge pump circuit contains a first input current source electrically connected to a first node of the charge pump circuit for supplying a first current to the charge pump circuit, the first current being equal to a predetermined amount of current multiplied by a first factor, and a second input current source electrically connected to a second node of the charge pump circuit for supplying a second current to the charge pump circuit, the second current being equal to the predetermined amount of current multiplied by a second factor. The charge pump circuit also includes a first output current source electrically connected to a third node of the charge pump circuit for receiving the first current from the charge pump circuit, and a second output current source electrically connected to a fourth node of the charge pump circuit for receiving the second current from the charge pump circuit. The charge pump circuit further contains a plurality of up pulse switches controlled by an up pulse control signal for controlling current flow such that in a charging mode of the charge pump circuit, a sum of the first current and the second current flows from the first node through the output node and through the resistor to the intermediate node, the first current flows from the intermediate node to the third node and flows out through the first output current source, and the second current flows from the intermediate node through the capacitor for charging the capacitor, and a plurality of down pulse switches controlled by a down pulse control signal for controlling current flow such that in a discharging mode of the charge pump circuit, the first current flows from the first node to the intermediate node, the second current flows from the capacitor to the intermediate node for discharging the capacitor, and the sum of the first current and the second current flows from the intermediate node through the output node, the resistor, and the third node before flowing out through the first and second output current sources.

It is an advantage of the claimed invention that the charge pump circuit contains more than one input current source, more than one output current source, and the plurality of up pulse switches and down pulse switches. The addition of these common circuit components allows the charge pump to limit the amount of current that is used for charging and discharging the capacitor to only the second current while still flowing the sum of the first and second currents through the resistor. By lowering the amount of current used for charging and discharging the capacitor, the capacitor can have a correspondingly smaller size. Therefore, used of the claimed invention charge pump circuit reduces overall size of an integrated circuit containing a PLL.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
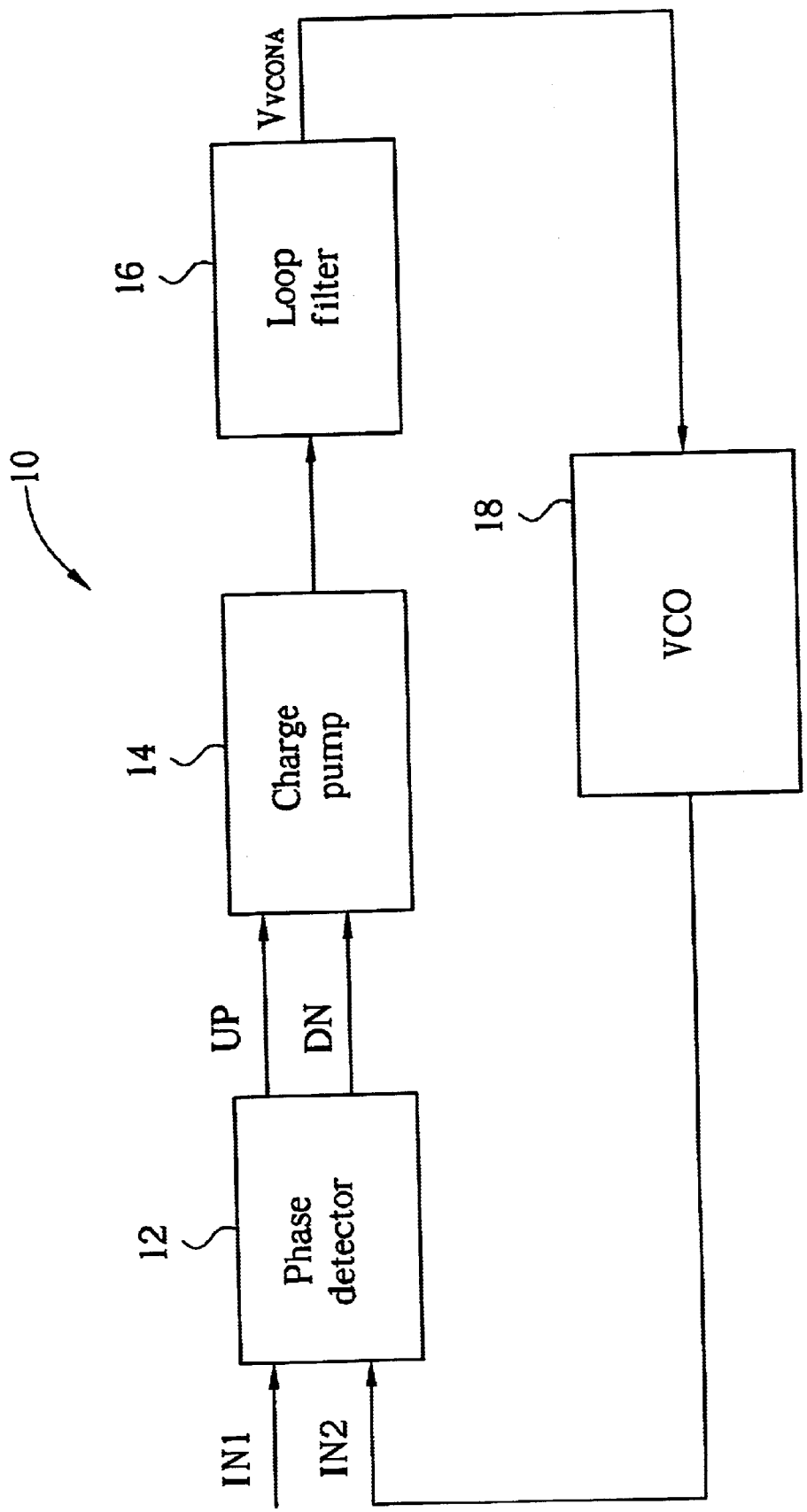
FIG. 1 is a block diagram of a phase locked loop (PLL) according to the prior art.
Figure 2:
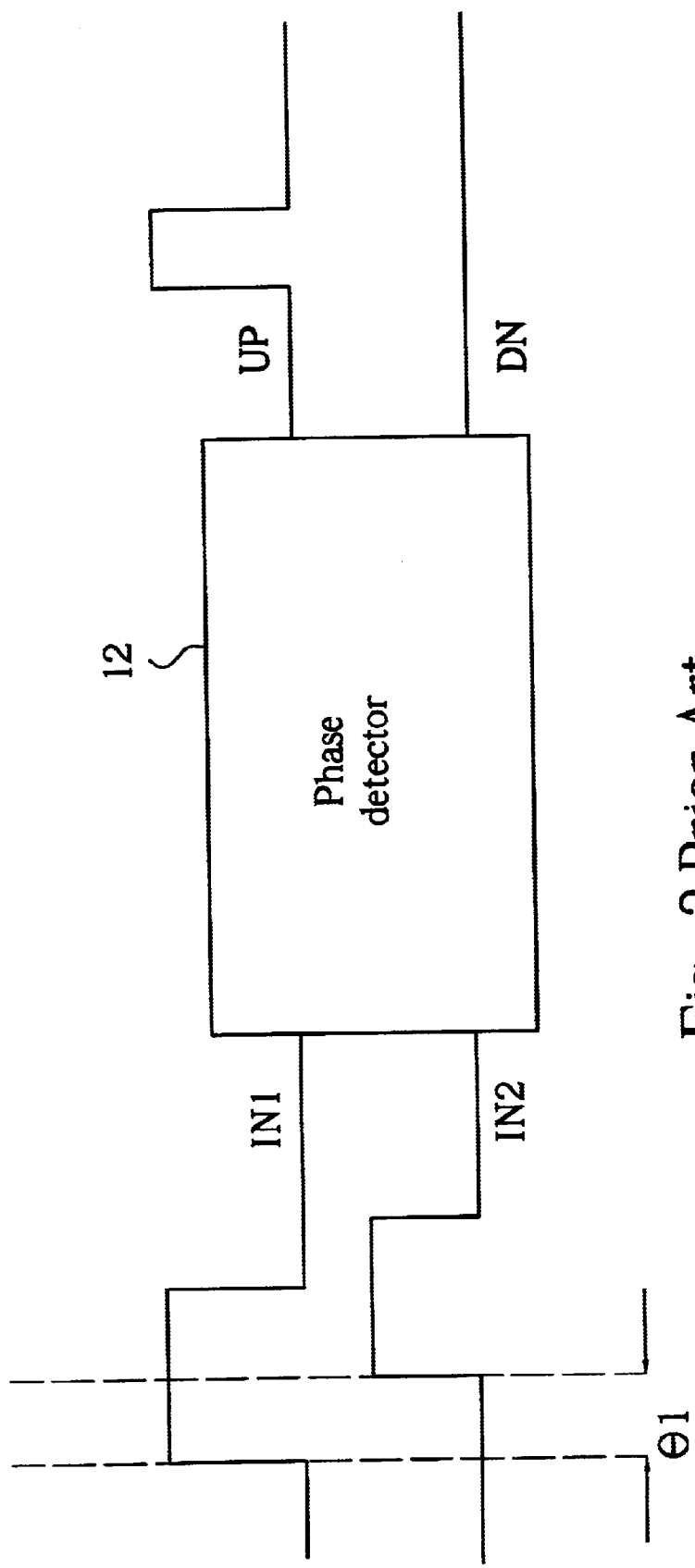
FIG. 2 is a diagram illustrating operation of a phase detector of the PLL when generating an up signal.
Figure 3:
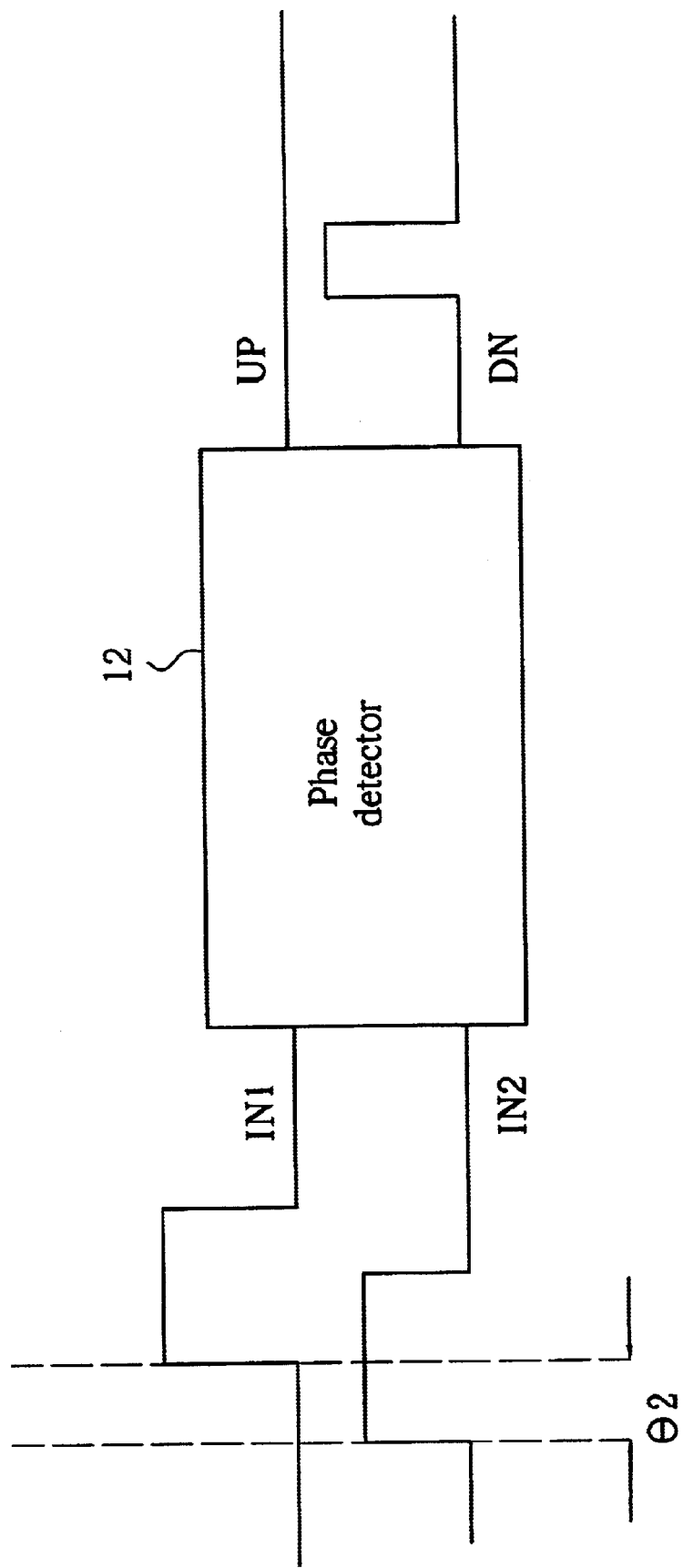
FIG. 3 is a diagram illustrating operation of the phase detector of the PLL when generating a down signal.
Figure 4:
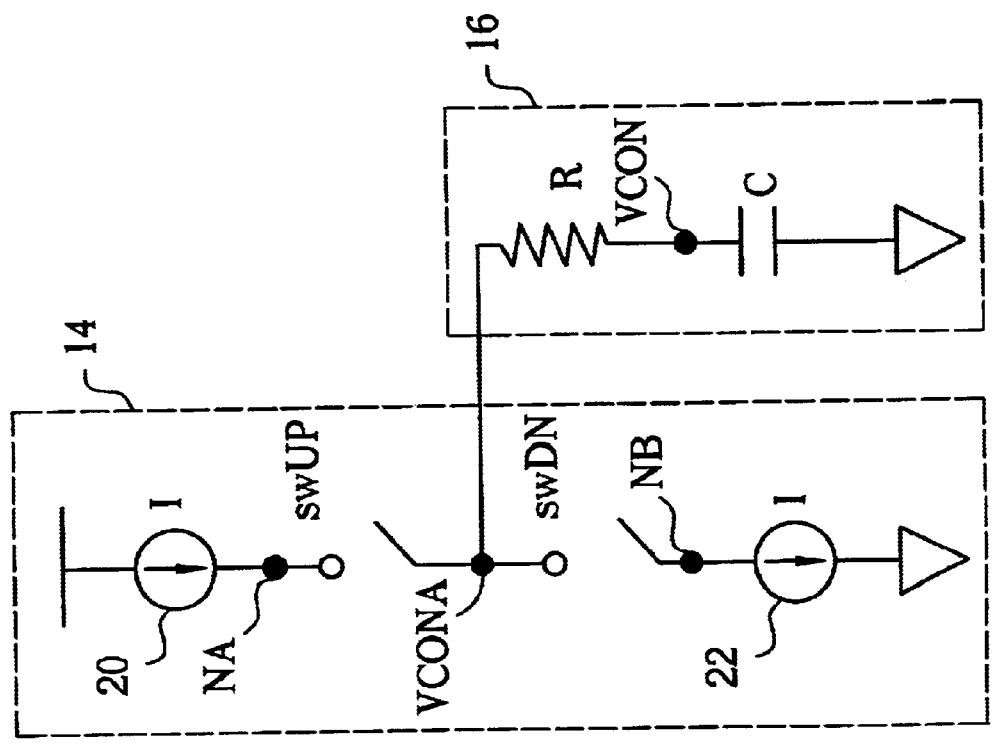
FIG. 4 is a circuit diagram of a charge pump circuit and a loop filter of the prior art.
Figure 7:
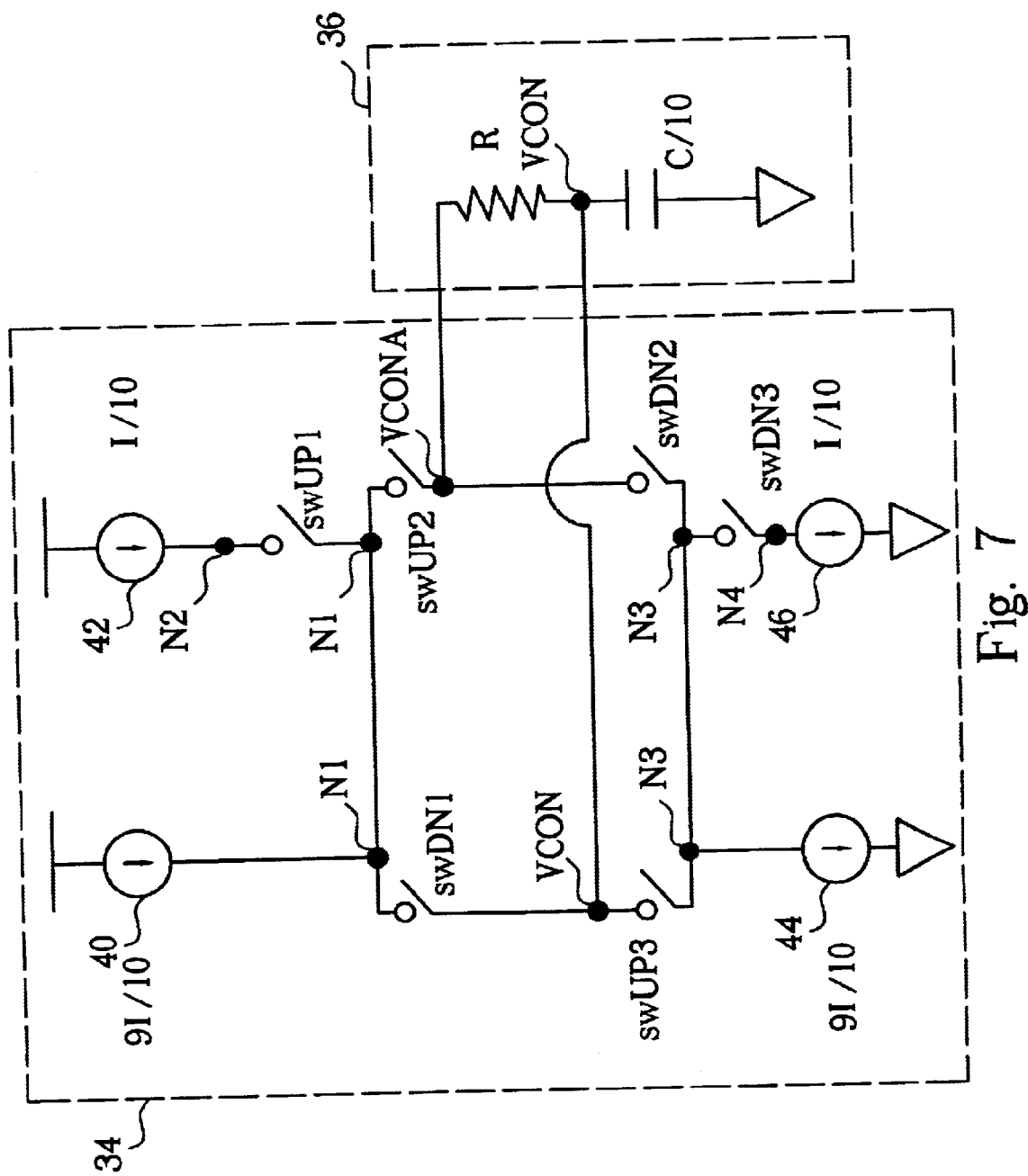
FIG. 7 is a circuit diagram of a charge pump circuit and a loop filter of the present invention.

Please refer to FIG. 7. FIG. 7 is a circuit diagram of a charge pump circuit 34 and a loop filter 36 of the present invention. The charge pump circuit 34 of the present invention substitutes for the charge pump circuit 14 of the prior art, and the loop filter 36 substitutes for the loop filter 16. The phase detector 12 and the VCO 18 shown in FIG. 1 are used just as they were with the prior art, and for brevity will not be explained again.

The loop filter 36 is identical to the loop filter 16 of the prior art, except that the capacitor C of the prior art loop filter 16 has been renamed as a capacitor C/10 of the loop filter 36. The new name is used to emphasize that by using the present invention charge pump circuit 34, the capacitor C/10 of the loop filter 36 can be made smaller than in the prior art. The loop filter 36 contains the resistor R electrically connected, to the charge pump circuit 34 at the output node VCONA and the capacitor C/10 electrically connected to the resistor R at the intermediate node VCON.

The charge pump circuit 34 of the present invention contains a first input current source 40 electrically connected to a node N1 of the charge pump circuit 34 for supplying a current with a magnitude of 9I/10 to the charge pump circuit 34. The current 9I/10 is equal to the current I outputted by the input current source 20 of the prior art multiplied by a first factor of 9/10. This factor is used as an example only, and any factor between 0 and 1 can be used. The charge pump circuit 34 also a second input current source 42 electrically connected to a node N2 of the charge pump circuit 34 for supplying a current with a magnitude of I/10 to the charge pump circuit 34. The current I/10 is equal to the current I outputted by the input current source 20 of the prior art multiplied by a second factor of 1/10. Again, this factor is used only as an example. The present invention charge pump circuit 34 is built using two input current sources 40 and 42 in a preferred embodiment. Therefore, a sum of the first and second factors 9/10 and 1/10 is shown adding up to a value of 1. This ensures that such that the sum of the currents 9I/10 and 1/10 is consistent with the current I outputted from the prior art input current source 20. As will be explained in greater detail later, a magnitude chosen for the second factor 1/10 determines the corresponding capacitance of the capacitor C/10 in the loop filter 36.

The charge pump circuit 34 also contains a first output current source 44 electrically connected to a node N3 of the charge pump circuit 34 for receiving the current 9I/10 from the charge pump circuit 34. Similarly, a second output current source 46 is electrically connected to a node N4 of the charge pump circuit 34 for receiving the current I/10 from the charge pump circuit 34. In a preferred embodiment of the present invention, the current 9I/10 supplied by the first input current source 40 should be equal to the current 9I/10 received by the first output current source 44 and the current I/10 supplied by the second input current source 42 should be equal to the current I/10 received by the second output current source 46.

Analogous to the up pulse switch swUP of the prior art charge pump circuit 14, the present invention charge pump circuit 34 contains a first up pulse switch swUP1, a second up pulse switch swUP2, and a third up pulse switch swUP3. The first up pulse switch swUP1 is connected between the node N2 and the node N1, the second up pulse switch swUP2 is connected between the node N1 and the output node VCONA, and the third up pulse swUP3 switch is connected between the intermediate node VCON and the node N3. Each of the up pulse switches swUP1, swUP2 and swUP3 is controlled by the up signal UP that is outputted by the phase detector 12. When a pulse from the up signal UP is received by the charge pump circuit 34, all of the up pulse switches swUP1, swUP2, and swUP3 are closed such that the charge pump circuit 34 and the loop filter 36 are in a charging mode and the capacitor C/10 is charged. At all other times, the up pulse switches swUP1, swUP2, and swUP3 remain open.

Also, similar to the down pulse switch swDN of the prior art charge pump circuit 14, the present invention charge pump circuit 34 contains a first down pulse switch swDN1, a second down pulse switch swDN2, and a third down pulse switch swDN3. The first down pulse switch swDN1 is connected between the node N1 and the intermediate node VCON, the second down pulse switch swDN2 is connected between the output node VCONA and the node N3, and the third down pulse swDN3 switch is connected between the node N3 and the node N4. Each of the down pulse switches swDN1, swDN2, and swDN3 is controlled by the down signal DN that is outputted by the phase detector 12. When a pulse from the down signal DN is received by the charge pump circuit 34, all of the down pulse switches swDN1, swDN2, and swDN3 are closed such that the charge pump circuit 34 and the loop filter 36 are in a discharging mode and the capacitor C/10 is discharged. At all other times, the down pulse switches swDN1, swDN2, and swDN3 remain open.

As shown in FIG. 7, both the up pulse switches swUP1, swUP2, and swUP3 and the down pulse switches swDN1, swDN2, and swDN3 are shown open since neither the up signal UP nor the down signal DN are received by the charge pump circuit 34. Therefore, no current is able to flow from the charge pump circuit 34 to the loop filter 36 in order to charge or discharge the capacitor C/10.

Figure 8:
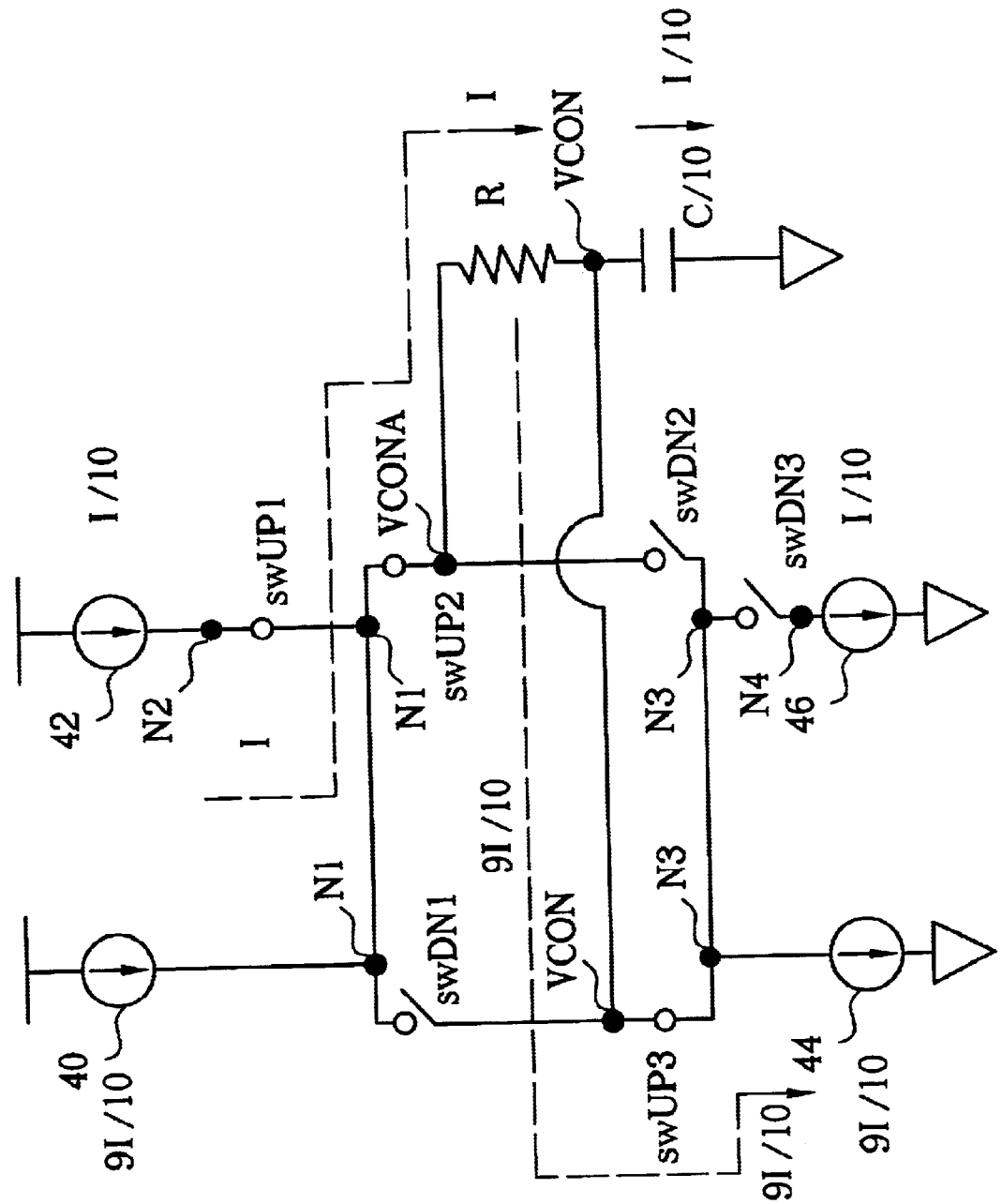
FIG. 8 is a circuit diagram of the present invention charge pump circuit and loop filter in a charging mode.

Please refer to FIG. 8. FIG. 8 is a circuit diagram of the present invention charge pump circuit 34 and loop filter 36 in the charging mode. In FIG. 8, the charge pump circuit 34 receives a pulse of the up signal UP from the phase detector 12. Therefore, the up pulse switches swUP1, swUP2, and swUP3 are closed and the down pulse switches swDN1, swDN2, and swbN3 are open.

Dotted lines are shown illustrating paths of three currents. Currents from the first and second input current sources 40 and 42 combine at node N1 and the sum of the currents 9I/10 and I/10 forms a current with a magnitude of I. The current I then flows through the output node VCONA to the intermediate node VCON. From the intermediate node VCON, a current with a magnitude of 9I/10 flows through node N3 and is received by the first output current source 44. Finally, the remaining current has a magnitude of I/10. This current flows from the intermediate node VCON through the capacitor C/10 for charging the capacitor C/10. Kirchhoff's Current Law (KCL) can be used to analyze all of the currents entering and leaving the intermediate node VCON. The only current entering node VCON is 1. The currents leaving node VCON are 9I/10 +I/10, adding up to a total of 1. Thus, KCL verifies the current quantities flowing into and out of the intermediate node VCON.

Figure 9:
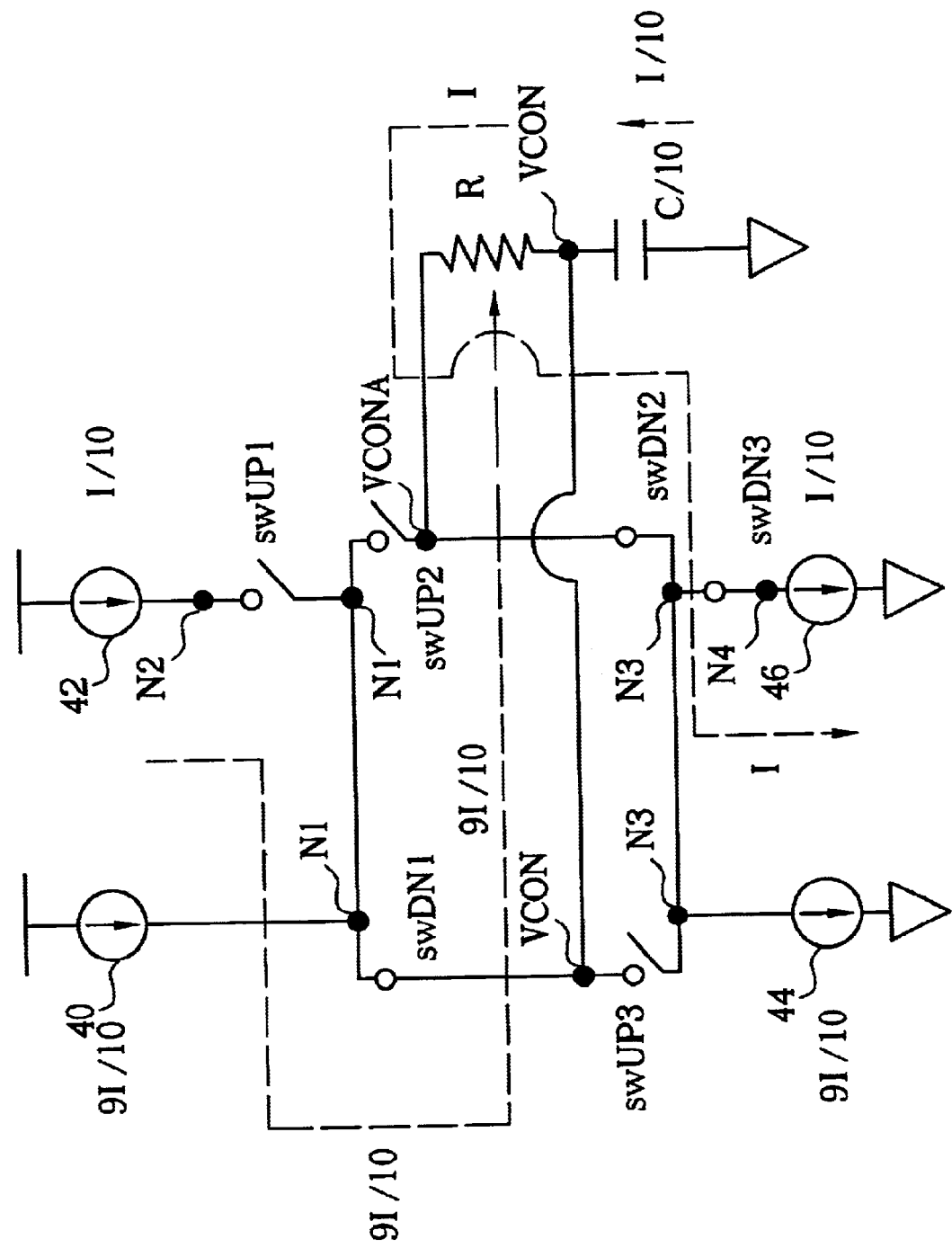
FIG. 9 is a circuit diagram of the present invention charge pump circuit and loop filter in a discharging mode.

Please refer to FIG. 9. FIG. 9. is a circuit diagram of the present invention charge pump circuit 34 and loop filter 36 in the discharging mode. In FIG. 9, the charge pump circuit 34 receives a pulse of the down signal DN from the phase detector 12. Therefore, the down pulse switches swDN1, swDN2, and swDN3 are closed and the up pulse switches swUP1, swUP2, and swUP3 are open.

Dotted lines are shown illustrating paths of three currents. Current 9I/10 from the first input current source 40 flows from node N1 to the intermediate node VCON. From the intermediate node VCON, a current with a magnitude of I flows through node N3 and is received by the first and second output current sources 44 and 46. Finally, the remaining current has a magnitude of I/10. This current flows from the capacitor C/10 to the intermediate node for discharging the capacitor C/10. Kirchhoff's Current Law (KCL) can again be used to analyze all of the currents entering and leaving the intermediate node VCON. The only current leaving node VCON is I. The currents entering node VCON are 9I/10+I/10, adding up to a total of I. Thus, KCL verifies the current quantities flowing into and out of the intermediate node VCON.

Figure 5:
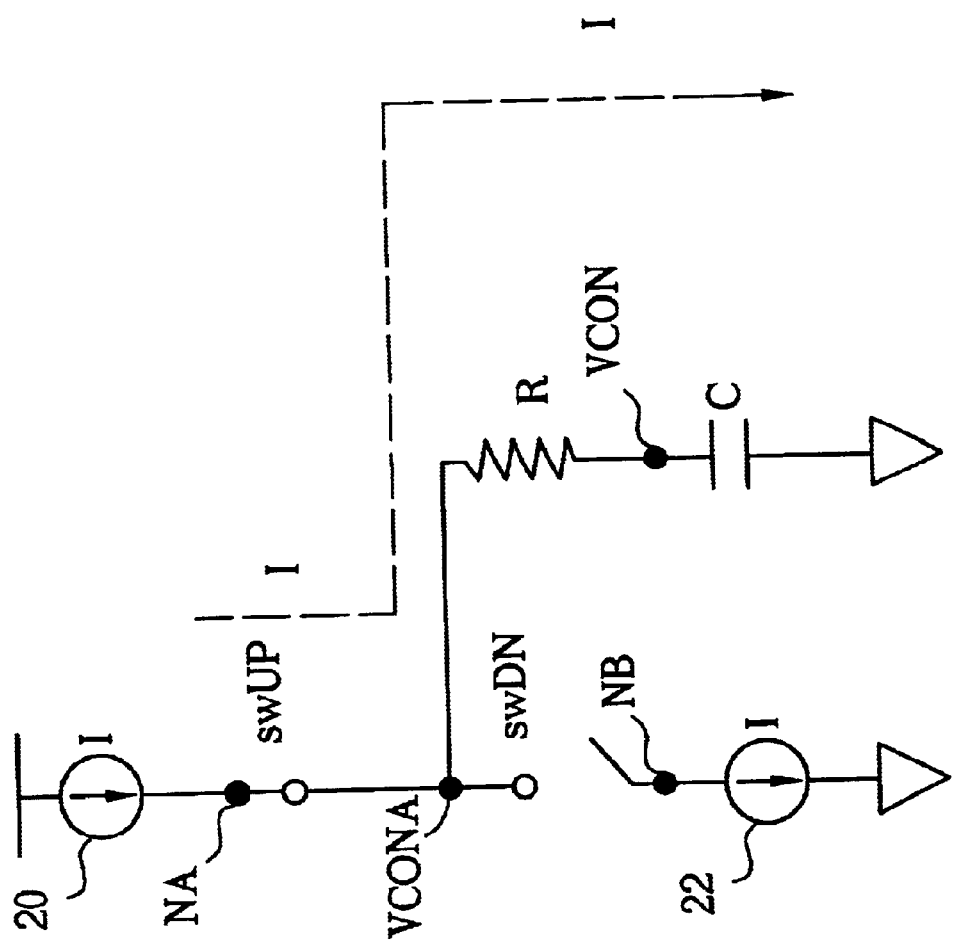
FIG. 5 is a circuit diagram of the prior art charge pump circuit and loop filter in a charging mode.

Please recall that the voltage $V_{VCONA}$ of the output node VCONA is outputted to the VCO 18 for controlling operation of the VCO 18. That means the present invention charge pump circuit 34 and loop filter 36 should be designed such that $V_{VCONA}$ has the same behavior in the present invention as with the prior art. Referring back to Eqn.3, it is seen that $V_{VCONA}$ depends on the sum of IR and $V_{VCONA}$. Please refer to FIG. 5 and FIG. 8. In each figure, the current flowing through the resistor R has a magnitude of I. Therefore the quantity IR is the same for the prior art and the present invention. In order to see that the voltage $V_{VCON}$ is the same in the present invention and the prior art, it is helpful to look at the relationship between i and C in Eqn.1 and Eqn.2. Since i is directly proportional to C, the values of i and C can each be divided by any constant k, and Eqn.2 will still hold true. Thus, in FIG. 8, the capacitor C/10 has a magnitude which is one-tenth that of the capacitor C shown in FIG. 5. Likewise, the current I/10 flowing through the capacitor C/10 has a magnitude which is one-tenth that of the current I flowing through the capacitor C in FIG. 5. Upon re-examining Eqn. 1, it can be concluded that since the relative sizes of i and C is exactly equal between the present invention and the prior art, the change in voltage during the charging process must be the same. Therefore, the behavior of $V_{VCON}$ is the same in the prior art and the present invention during the charging process, which means the behavior of $V_{VCONA}$ is the same as well.

Figure 6:
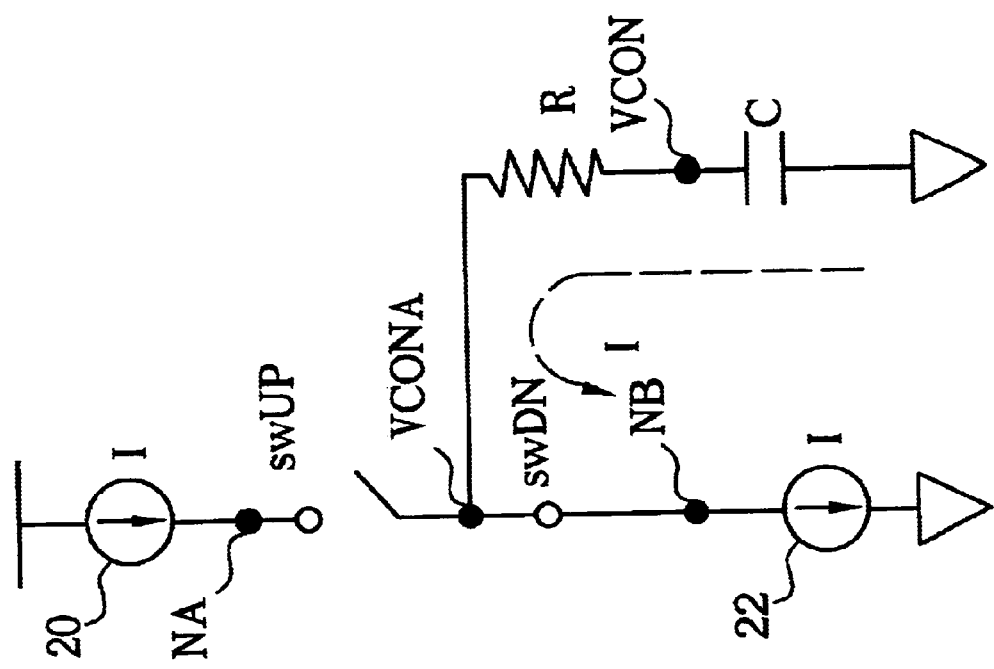
FIG. 6 is a circuit diagram of the prior art charge pump circuit and loop filter in a discharging mode.

The above explanation of the behavior of $V_{VCONA}$ being equal for the prior art and the present invention is also true for the discharging processes shown in FIG. 6 and FIG. 9. Only the direction of the currents flowing through C/10 and R changes, and the behavior of voltage $V_{VCONA}$ will remain the same in both the prior art and the present invention.

The present invention allows the smaller capacitor C/10 to be used, with one-tenth the size of capacitor C, and still maintains identical behavior of the output voltage $V_{VCONA}$ that is fed into the VCO 18. Of course, please remember that the factor one-tenth is used as an example only for easier description. In the charge pump circuit 34 of the present invention, the up pulse switches swUP1, swUP2, and swUP3 and the down pulse switches swDN1, swDN2, and swDN3 may be formed using transistors such as MOS transistors or by any other circuitry that acts as a switch.

Compared to the prior art charge pump circuit 14 the charge pump circuit 34 of the present invention uses two input current sources 40 and 42 that input different magnitudes of current, two output current sources 44 and 46 that output different magnitudes of current, and several up pulse switches swUP1, swUP2, and swUP3 and down pulse switches swDN1, swDN2, and swDN3. By using the switches to control the current flow to and from the current sources, the charge pump circuit 34 ensures that the amount of current that flows through the capacitor C/10 is only a fraction of the current that flows through the resistor R. This property of the charge pump circuit 34 allows the capacitor C/10 of the loop filter 36 to be a fraction of the size of the capacitor C in the prior art loop filter 16. When forming the present invention charge pump circuit 34 and loop filter 36 on an integrated circuit, the capacitor C/10 will take up considerably less area on the IC than was the case with the prior art Thus, the present invention will make it easier to design and build smaller ICs that incorporate a PLL.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A charge pump circuit for reducing capacitance in a loop filter of a phase locked loop, the loop filter comprising a resistor electrically connected to the charge pump circuit at an output node and a capacitor being electrically connected to the resistor at an intermediate node, the charge pump circuit comprising:

a first input current source electrically connected to a first node of the charge pump circuit for supplying a first current to the charge pump circuit, the first current being equal to a predetermined amount of current multiplied by a first factor;

a second input current source electrically connected to a second node of the charge pump circuit for supplying a second current to the charge pump circuit, the second current being equal to the predetermined amount of current multiplied by a second factor;

a first output current source electrically connected to a third node of the charge pump circuit for receiving the first current from the charge pump circuit; a second output current source electrically connected to a fourth node of the charge pump circuit for receiving the second current from the charge pump circuit;

a plurality of up pulse switches controlled by an up pulse control signal for controlling current flow such that in a charging mode of the charge pump circuit, a sum of the first current and the second current flows from the first node through the output node and through the resistor to the intermediate node, the first current flows from the intermediate node to the third node and flows out through the first output current source, and the second current flows from the intermediate node through the capacitor for charging the capacitor: and a plurality of down pulse switches controlled by a down pulse control signal for controlling current flow such that in a discharging mode of the charge pump circuit, the first current flows from the first node to the intermediate node, the second current flows from the capacitor to the intermediate node for discharging the capacitor, and the sum of the first current and the second current flows from the intermediate node through the output node, the resistor, and the third node before flowing out through the first and second output current sources.

2. The charge pump circuit of claim 1 wherein the plurality of up pulse switches comprises a first, up pulse switch, a second up pulse switch, and a third up pulse switch, and the first up pulse switch is connected between the second node and the first node, the second up pulse switch is connected between the first node and the output node, and the third up pulse switch is connected between the intermediate node and the third node.

3. The charge pump circuit of claim 2 wherein the plurality of down pulse switches comprises a first down pulse switch, a second down pulse switch, and a third down pulse switch, and the first down pulse switch is connected between the first node and the intermediate node, the second down pulse switch is connected between the output node and the third node, and the third down pulse switch is connected between the third node and the fourth node.

4. The charge pump circuit of claim 3 wherein when the up pulse control signal is active and the charge pump circuit is in the charging mode, the first, second, and third up pulse switches close and the first, second, and third down pulse switches open.

5. The charge pump circuit of claim 3 wherein when the down pulse control signal is active and the charge pump circuit is in the discharging mode, the first, second, and third down pulse switches close and the first, second, and third up pulse switches open.

6. The charge pump circuit of claim 1 wherein the first and second factors are values less than one, and a sum of the first and second factors equals to one.

7. The charge pump circuit of claim 6 wherein the second factor is less than the first factor.

8. The charge pump circuit of claim 1 wherein the up pulse switches and the down pulse switches are transistors.

9. A method of reducing capacitance in a loop filter of a phase locked loop, the loop filter comprising a resistor electrically connected to a charge pump circuit at an output node and a capacitor being electrically connected to the resistor at an intermediate node, the method comprising:

providing a first input current source electrically connected to a first node of the charge pump circuit for supplying a first current to the charge pump circuit, the first current being equal to a predetermined amount of current multiplied by a first factor;

providing a second input current source electrically connected. to a second node of the charge pump circuit for supplying a second current to the charge pump circuit, the second current being equal to the predetermined amount of current multiplied by a second factor;

providing a first output current source electrically connected to a third node of the charge pump circuit for receiving the first current from the charge pump circuit;

providing a second output current source electrically connected to a fourth node of the charge pump circuit for receiving the second current from the charge pump circuit;

controlling a plurality of up pulse switches with an up pulse control signal for controlling current flow such that in a charging mode of the charge pump circuit, a sum of the first current and the second current flows from the first node through the output node and through the resistor to the intermediate node, the first current flows from the intermediate node to the third node and flows out through the first output current source, and the second current flows from the intermediate node through the capacitor for charging the capacitor; and controlling a plurality of down pulse switches with a down pulse control signal for controlling current flow such that in a discharging mode of the charge pump circuit, the first current flows from the first node to the intermediate node, the second current flows from the capacitor to the intermediate node for discharging the capacitor, and the sum of the first current and the second current flows from the intermediate node through the output node, the resistor, and the third node before flowing out through the first and second output current sources.

10. The method of claim 9 wherein the plurality of up pulse switches comprises a first up pulse switch, a second up pulse switch, and a third up pulse switch, and the first up pulse switch is connected between the second node and the first node, the second up pulse switch is connected between the first node and the output node, and the third up pulse switch is connected between the intermediate node and the third node.

11. The method of claim 10 wherein the plurality of down pulse switches comprises a first down pulse switch, a second down pulse switch, and a third down pulse switch, and the first down pulse switch is connected between the first node and the intermediate node, the second down pulse switch is connected between the output node and the third node, and the third down pulse switch is connected between the third node and the fourth node.

12. The method of claim 11 wherein when the up pulse control signal is active and the charge pump circuit is in the charging mode, the first, second, and third up pulse switches close and the first, second, and third down pulse switches open.

13. The method of claim 11 wherein when the down pulse control signal is active and the charge pump circuit is in the discharging mode, the first, second, and third down pulse switches close and the first, second, and third up pulse switches open.

14. The method of claim 9 wherein the first and second factors are values less than one, and a sum of the first and second factors equals to one.

15. The method of claim 14 wherein the second factor is less than the first factor.

16. The method of claim 9 wherein the up pulse switches and the down pulse switches are transistors.

* * * * *